United States Patent
Zhong et al.

(10) Patent No.: US 10,692,835 B2
(45) Date of Patent: Jun. 23, 2020

(54) BALL BOND ATTACHMENT FOR A SEMICONDUCTOR DIE

(71) Applicant: TEXAS INSTRUMENTS INCORPORATED, Dallas, TX (US)

(72) Inventors: Han Zhong, Chengdu (CN); Zi Qi Wang, Chengdu (CN); Chen Xiong, Chengdu (CN); Yong Qiang Tang, Chengdu (CN); Xi Lin Li, Chengdu (CN); Xiao Lin Kang, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/171,121

(22) Filed: Oct. 25, 2018

(65) Prior Publication Data

US 2019/0378814 A1    Dec. 12, 2019

Related U.S. Application Data

(63) Continuation of application No. PCT/CN2018/090120, filed on Jun. 6, 2018.

(51) Int. Cl.
| | |
|---|---|
| *H01L 21/00* | (2006.01) |
| *H01L 23/00* | (2006.01) |
| *H01L 21/48* | (2006.01) |
| *H01L 21/56* | (2006.01) |
| *H01L 21/78* | (2006.01) |

(52) U.S. Cl.
CPC .......... *H01L 24/78* (2013.01); *H01L 21/4825* (2013.01); *H01L 21/565* (2013.01); *H01L 21/78* (2013.01); *H01L 24/48* (2013.01); *H01L 24/85* (2013.01); *H01L 2224/48245* (2013.01); *H01L 2224/48465* (2013.01); *H01L 2224/78301* (2013.01); *H01L 2224/78804* (2013.01); *H01L 2224/85201* (2013.01)

(58) Field of Classification Search
CPC ......... H01L 24/78; H01L 24/85; H01L 24/48; H01L 21/78; H01L 21/565; H01L 21/4825; H01L 2224/78301; H01L 2224/85201; H01L 2224/48465; H01L 2224/48245; H01L 2224/78804
USPC ....................................................... 438/123
See application file for complete search history.

(56) References Cited

U.S. PATENT DOCUMENTS

| | | | | |
|---|---|---|---|---|
| 5,288,008 | A  * | 2/1994 | Haji ........................ | H01L 24/86 228/180.22 |
| 7,192,861 | B2 * | 3/2007 | Ano ........................ | H01L 24/85 228/180.22 |

(Continued)

OTHER PUBLICATIONS

PCT International Search Report Application No. PCT/CN2018/090120 dated Mar. 7, 2019, 4 pages.

*Primary Examiner* — Vu A Vu
(74) *Attorney, Agent, or Firm* — Dawn Jos; Charles A. Brill; Frank D. Cimino (57) ABSTRACT

A method for forming a ball bond for an integrated circuit formed on a semiconductor die includes forming a ball at a first send of a conductive wire inserted in a capillary tool and lowering the capillary tool toward a pad on the semiconductor die positioned on a support surface. The method further includes moving, using a motor, the support surface relative to the capillary tool to thereby bond the ball, without using ultrasound, to the pad and then raising the capillary tool.

17 Claims, 5 Drawing Sheets

(56) References Cited

U.S. PATENT DOCUMENTS

| | | | | |
|---|---|---|---|---|
| 7,918,378 | B1 * | 4/2011 | Pham | B23K 20/005 |
| | | | | 228/4.5 |
| 7,975,901 | B2 * | 7/2011 | Maeda | B23K 20/007 |
| | | | | 228/180.5 |
| 8,461,670 | B2 * | 6/2013 | Celaya | H01L 23/4952 |
| | | | | 257/676 |
| 2006/0175383 | A1 | 8/2006 | Mii et al. | |
| 2010/0059574 | A1 | 3/2010 | Arahata et al. | |
| 2011/0272449 | A1 | 11/2011 | Pirkle et al. | |
| 2011/0315743 | A1 | 12/2011 | Maruya et al. | |

\* cited by examiner

BALL BOND ATTACHMENT FOR A SEMICONDUCTOR DIE

BACKGROUND

Wirebonding is used to electrically connect contacts within a semiconductor package. A metal wire (e.g., gold, copper, etc.) has one end ball-bonded to a bond pad on semiconductor die, and another end stitch (or wedge) bonded to a lead on a leadframe. In order to form such connections, the wire is fed through a capillary associated with a moveable bond head. For a ball bond, a ball is formed on the exposed end of the wire using an electronic flame off (EFO) mechanism. The ball is pulled against the end of the capillary and is then pressed into position on a pre-heated bond pad where a combination of heat, pressure, and ultrasonic vibration is used to cause the ball to adhere to the surface of the bond pad. With the ball end of the wire secured to the bond pad, the wire is payed out through the capillary as the bond head moves into position at the appropriate lead on the leadframe. A stitch bond is formed on the lead, and a tail wire is payed out through the capillary, clamped, and then severed. A new ball is then formed readying the wire end for the next ball bond, and the cycle is repeated.

SUMMARY

In one example, a method for forming a ball bond for an integrated circuit formed on a semiconductor die includes forming a ball at a first send of a conductive wire inserted in a capillary tool and lowering the capillary tool toward a pad on the semiconductor die positioned on a support surface. The method further includes moving, using a motor, the support surface relative to the capillary tool to thereby bond the ball, without using ultrasound, to the pad and then raising the capillary tool. A wire bonding connection for an integrated circuit die pad also is disclosed made according to the disclosed processes.

BRIEF DESCRIPTION OF THE DRAWINGS

For a detailed description of various examples, reference will now be made to the accompanying drawings in which.

DETAILED DESCRIPTION

As noted above, ultrasound is typically used to bond a ball formed at the end of a wire to a pad on a semiconductor die. Ultrasound provides high frequency oscillation of the capillary which contains the wire to be bonded to the die. The high frequency oscillation of the ball due to the ultrasonic energy causes the ball to bond to the pad on the die. Unfortunately, ultrasound-based bonding of the ball to the die is not always stable and requires a relatively long time to make a sufficient electrical connection.

The disclosed examples use a scrubbing technique, instead of ultrasound, to adhere the ball to the semiconductor die. The scrubbing technique involves a lateral (back and forth) or circular motion of the ball relative to the pad on the semiconductor die. The scrubbing motion is implemented in some examples by a motor that moves the bonding table on which the semiconductor die resides relative to the capillary containing the wire during the ball bonding process. Depending on the diameter of the wire to be bonded to the die, an appropriate combination of scrub force, scrub amplitude, and the number of scrub cycles are used. Examples of these parameters for different wire diameters are provided below.

Figure 1:
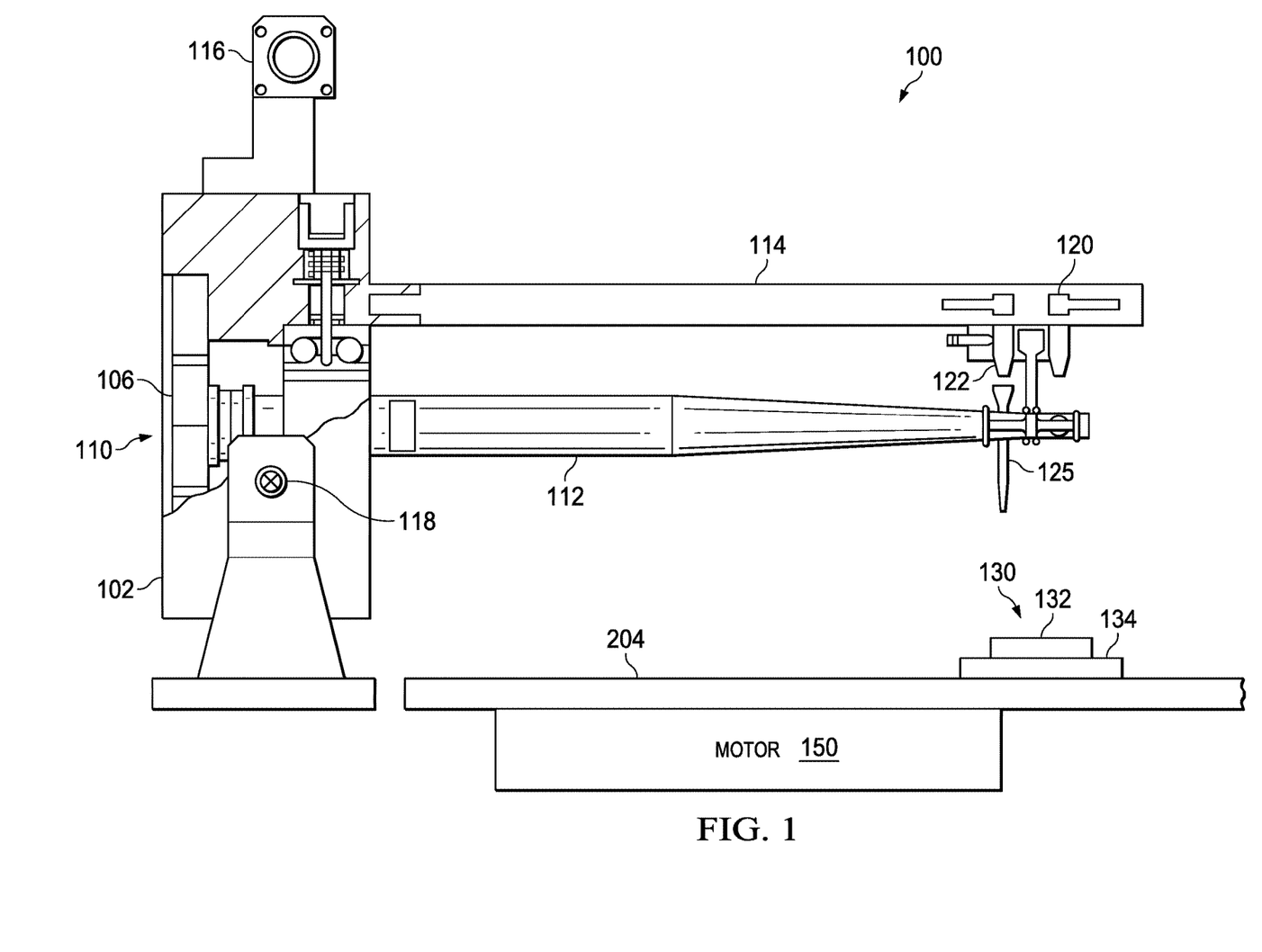
FIG. 1 illustrates a bond head assembly to form wire bonds on a semiconductor die in accordance with an example.

FIG. 1 illustrates an example of a bond head assembly 100. The bond head assembly 100 includes a bond head assembly housing 102 which can move in a plane defined by X and Y axes and which is positioned adjacent a bonding table 104. The X and Y axes define a plane that is parallel to the plane of the bonding table 104. An integrated circuit (IC) 130 is shown positioned on the bonding table 104. The IC 130 includes a semiconductor die 132 affixed to a leadframe 134. The bond head assembly 100 is operative to bond one or more wires between pads on the semiconductor die 132 and the leadframe 134 and to do so with a scrubbing action instead of using ultrasound. A motor 150 is attached to the bonding table 104 to move the bonding table 104 and thus the IC 130 and its semiconductor die 132 relative to a ball formed at an end of wire as described below.

A wire boom 114 and a capillary boom 112 extend from the housing 102. A mechanism including a galvo arm 116 and a pivot 118 is provided for raising and lowering the capillary boom 112. A capillary 125 is shown in the capillary boom 112. Additional components such as a wire clamp 120, a venturi 222, and a wire spool (not shown) are provided to accommodate feed control of the wire into the capillary 124 and maintain control of the wire during the process of bonding the wire to the semiconductor die 132 and leadframe 134. The capillary 125 can comprise any of various materials, dimensions and configurations based on the wire bonding application at hand.

A rotation mechanism 110 rotates the capillary boom 112 to bring the capillary 125 into alignment with a target pad on the semiconductor die 132. The rotation mechanism 110 may include stepper motors or other mechanical, electromechanical, or pneumatic mechanism to rotate the capillary boom 112.

Figure 2:
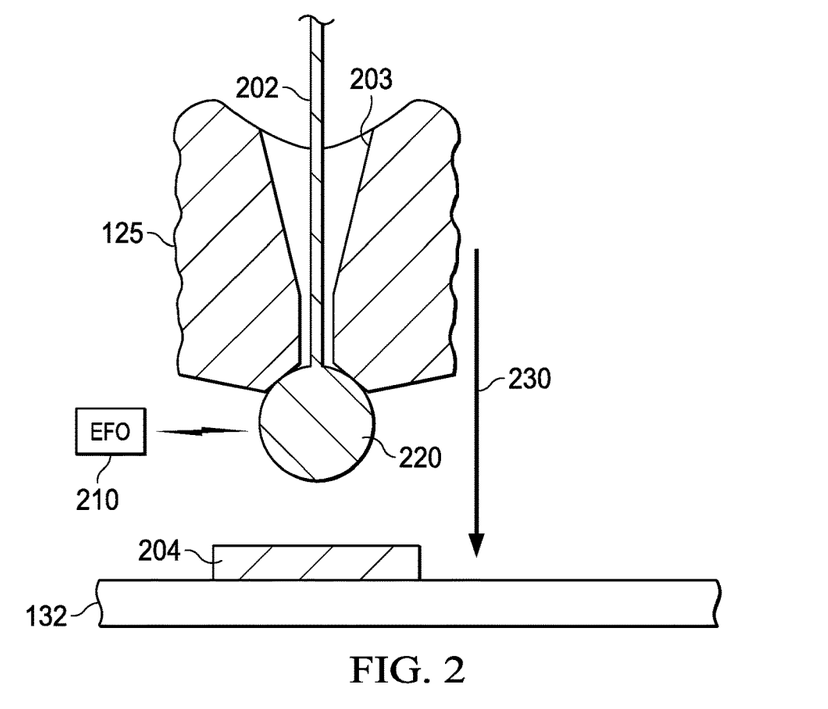
FIGS. 2-5 illustrate a time sequence of operations to form a ball bond on a semiconductor die in accordance with an example.

FIGS. 2-5 illustrate a process for bonding a wire 202 to a pad 204 on die 132. FIGS. 2-5 show a time sequence of operations. A partial cut-away view of capillary 125 is shown in FIG. 2. A wire 202 has been guided into a central bore 203 within the capillary 125. For example, a wire spool may feed wire through the venturi 222 and into the capillary 125. A ball-forming mechanism, such as electronic flame-off (EFO) 210, is activated to generate an electric spark that melts the end of the wire 202 to thereby form a ball 220 at the end of the wire. The capillary 125 is then lowered toward the pad 204 in the direction indicated by arrow 230 with a predetermined velocity. In one example, the velocity is 1.6 millimeters/second, although the speed can be other than that in other examples.

Figure 3:
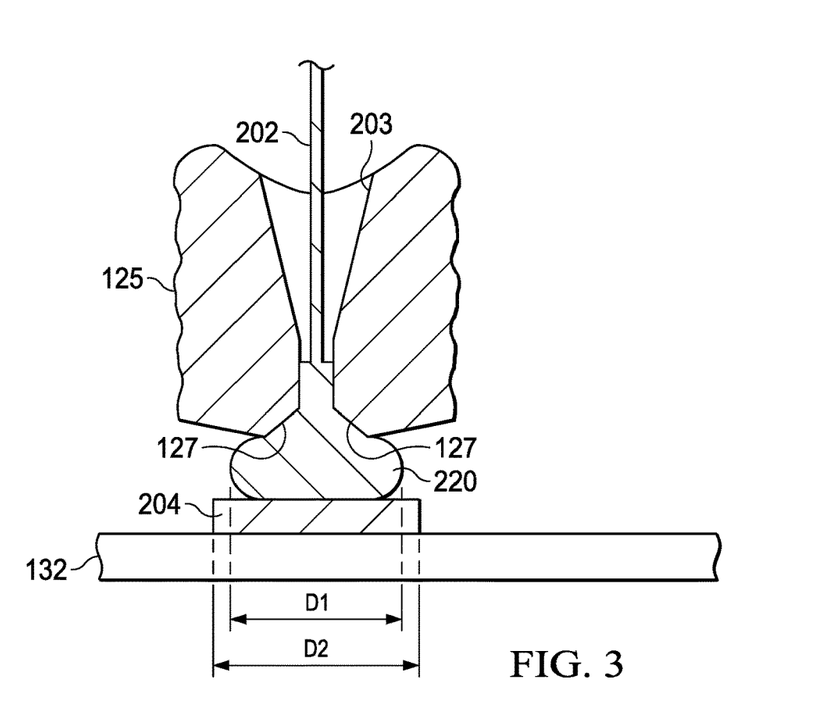

The ball 220 is in molten form as it contacts the pad 204. Through contact of the pad 204, the shape of the ball 220 is transformed into a somewhat flattened disk as shown in FIG. 3. The bottom edge 127 of the capillary 125 functions to partially control the shape of the ball 220 as it is pushed against the pad 204. The diameter of the ball 220 increases between its spherical shape in FIG. 2 and its partially flattened shape in FIG. 3. The diameter of the partially flattened ball 220 in FIG. 3 is shown as D1. Before the scrubbing begins, the width of the pad 204 is designated as D2. D1 is between approximately 70% and 70% of D2 in some examples. The pad 204 is heated, or has already been heated to a temperature of approximately 250 degrees centrigrade.

Figure 4:
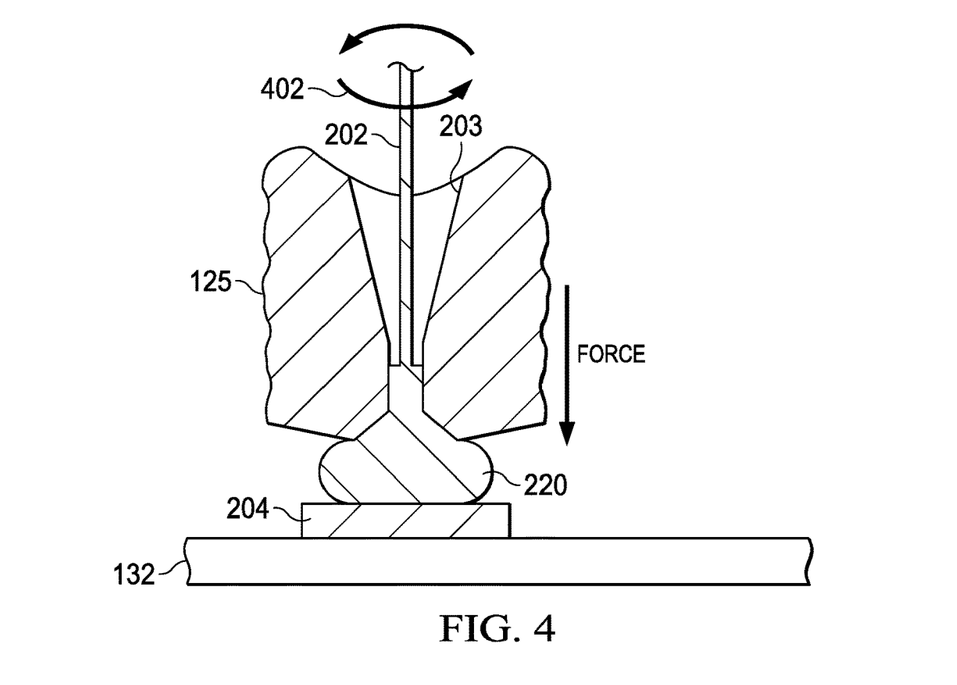
Figure 5:
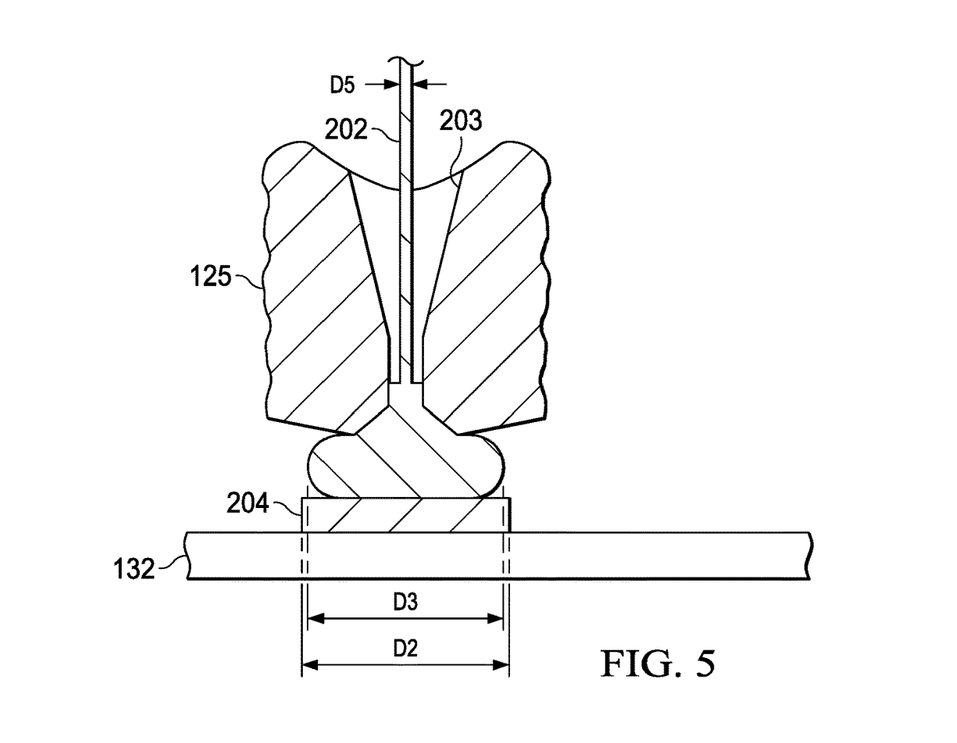

In FIG. 4, the motor 150 is activated to move the semiconductor die 132 and its pad 204 relative to the partially flattened ball 220. The scrubbing motion can be approximately circular as indicated by arrow 402 in FIG. 4, or the scrubbing motion can be approximately linear. The scrubbing motion and force applied between the ball and the die causes the ball to deform and attach to the die pad 204. As a result of the scrubbing motion, the partially flattened ball expands out even further to provide a diameter of D3 as indicated in FIG. 5. In some examples, following the scrubbing motion D3 is between approximately 90% and 95% of D2.

The scrubbing motion of the pad 204 relative to the ball 220 is characterized by various parameters, and the values of the parameters depend on the diameter D5 (FIG. 5) of the wire. The para meters include scrub force, scrub amplitude, and scrub cycle. Scrub force is the downward force on the ball 220 against the pad 204 during the scrubbing motion. Scrub amplitude is the distance traced out by the ball 220 relative the pad 204. For a circular motion scrubbing action, the scrubbing amplitude is the radius of the circle traced by the ball 220 relative to the pad 204. For a linear motion scrubbing action, the scrubbing amplitude is the lateral distance traced by the ball 220 relative the pad 204. The scrub cycle parameter is the number of complete cycles of the ball's motion relative to the pad 204. For example, if the scrubbing action is circular, the number of scrub cycles is the number of 360 degree cycles through which the ball 220 progresses relative to the pad 204. If the scrubbing action is linear, the number of scrub cycles is the number times the ball moves from side of the pad 204 to the other side and then back.

The table below provides suitable values of the scrub force, scrub amplitude and scrub cycles for three illustrative wire diameters-0.96 millimeters ("mils"), 1.3 mils, and 1.98 mils.

| Wire Diameter (mils) | Scrub Force (grams) | Scrub Amplitude | Scrub Cycles |
|---|---|---|---|
| 0.96 | 50 to 60 | 4 to 5.5 | 5 |
| 1.3 | 45 to 65 | 5 to 6 | 6 |
| 1.98 | 100 to 110 | 10 to 11 | 4 |

Figure 6:
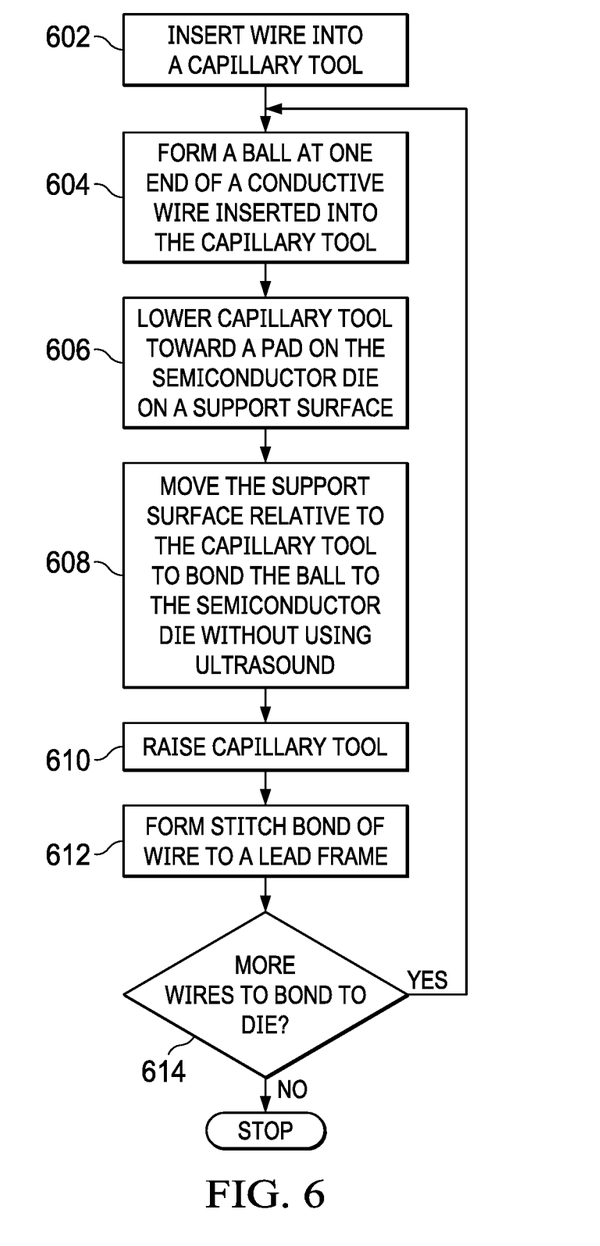
FIG. 6 shows a method for attaching a semiconductor die to a leadframe in accordance with an example.

FIG. 6 shows an example of a method for employing scrubbing to attach a wire to a semiconductor die pad. At 602, the wire is inserted into a capillary tool (e.g., capillary 125). The wire can be fed from a wire spool via any of a variety of mechanical structures. At 604, the method of FIG. 6 includes forming a ball at one end of the conductive wire that has been inserted into the capillary tool. In one example, the ball may be formed via an electronic flame-out as explained above.

At 606, the illustrative method includes lowering the capillary tool toward the pad on the semiconductor die positioned on a support surface (e.g., bonding table 104). The downward motion of the capillary tool towards the pad results in application of a force of the ball on the pad that depends on the diameter of the wire. Examples of such forces are provided in the table above.

At 608, the method includes moving, using a motor, the support surface (e.g., the bonding table 104) relative to the capillary tool to thereby bond the ball, without using ultrasound, to the pad. The scrubbing motion of operation 608 can be circular or linear as noted above, or elliptical or other motion as desired. The scrub amplitude and the number of scrub cycles also depends on the wire diameter, examples of which are provided above in the table. The capillary tool is then raised at 610, either by actively raising the capillary tool or actively lowering the support surface.

At 612, the illustrative method includes forming a stitch bond of the wire to a contact point on the leadframe 134. In one example, the stitch bond is formed by moving the capillary tool to form a loop in the wire, moving the capillary tool over the contact point on the lead frame, lowering the capillary tool to the leadframe, bonding the wire to the leadframe (e.g., using scrubbing), clamping and puling the wire from the leadframe to cut the wire. The machine used to attach the wires to the semiconductor die and the leadframe is programmed to determine at 614 whether an additional wire is to be connect the die to the leadframe, and if so, the process repeats at 604. If, however, no additional wires are needed then the process stops.

In some examples, multiple semiconductor dies 132 are formed on a common wafer. The wafer is then singulated to obtain the individual dies. Each such die have multiple pads to be wire bonded to corresponding connection points on a leadframe. In some examples, each of the wire bonds are made according to the techniques described herein. Once all of the die pads are wire bonded to connection points on a corresponding leadframe, the die and leadframe are then encapsulated in a mold compound material (e.g., a polymer resin including filler particles made from silica, alumina or other suitable material) as part of the packaging process.

Figure 7:
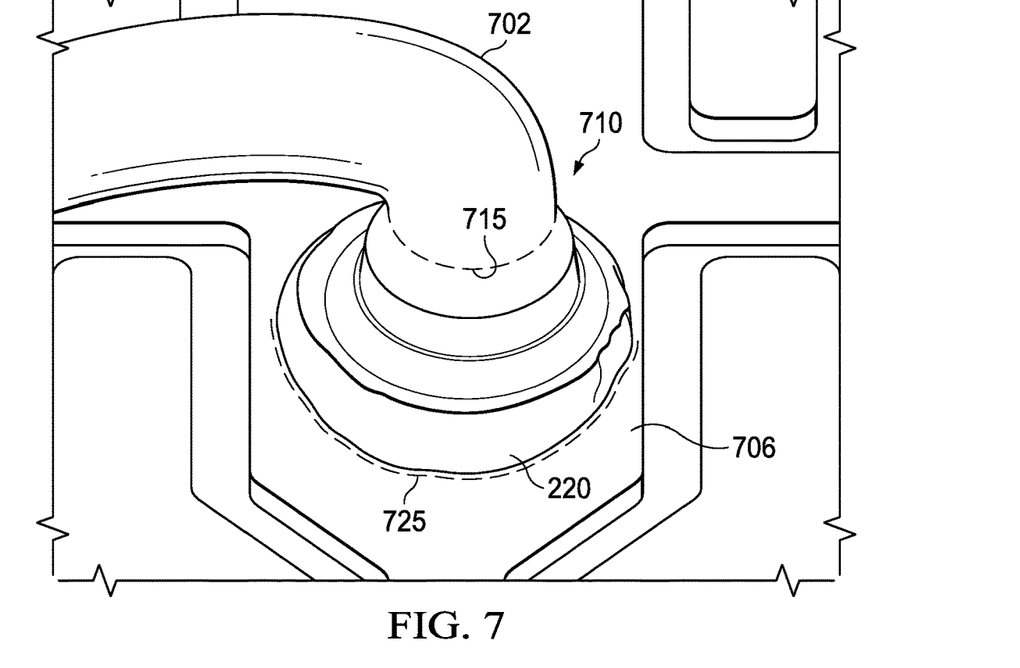
FIG. 7 shows an example of a ball bond formed according to the disclosed examples.

The disclosed examples are also directed to the resulting wire bonding connection for the semiconductor die pad made according to the disclosed process. FIG. 7 shows an example of a wire 702 attached to a pad 706 on a semiconductor die. The ball bond resulting from the scrubbing motion and without the use of ultrasound is shown at 710. The resulting ball 220 has a more regular shape than would have been the case if ultrasound and no scrubbing motion was used. The disclosed scrubbing action makes the resulting ball bond more uniform and regular (as illustrated below) than would have been the case with the use of ultrasound or another non-scrubbing bonding technique. The resulting ball bond connection is more stable and structurally sound (e.g., less like to crack or otherwise experience a structural failure) and can be formed more quickly than if ultrasound was used. Reference numeral 715 identifies the outline of the circumference of the wire 702 as it attaches to ball 220 and reference numeral 725 identifies the outline of the ball 220.

Figure 8:
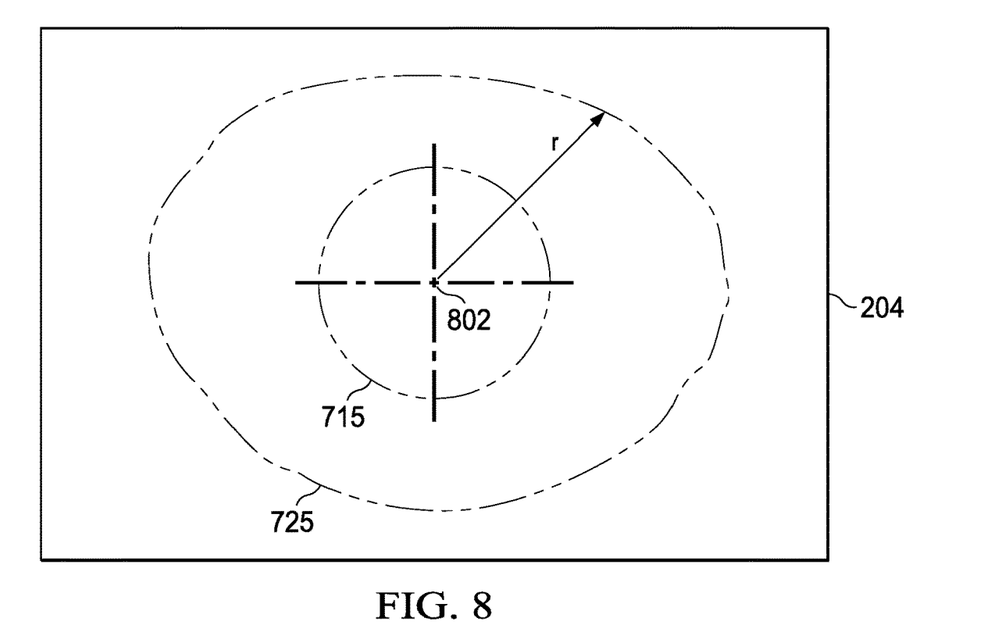
FIG. 8 illustrates the relative uniformness of the ball bond formed according to the disclosed examples.

FIG. 8 shows a top-down view of the ball bond showing the semiconductor die pad 204, the outline 7255 of the ball and the outline 715 of the wire. The wire outline 715 is generally circular as the cross-sectional area of the wire is circular. The outline 725 of the ball is not necessarily circular, but is more circular than would have been the case had ultrasound been used instead of the scrubbing action described herein. Reference 802 identifies center of the wire outline 715 and the distance between the geometric center 802 to the ball outline 725 is shown as radius r. As a 360 degree arc is traced around the ball outline 725, the length of radius r varies by less than approximately 4%. "CPK" refers to how centered the output of a process is between its lower and upper specification limits and variable the output is. CPK may be expressed as a ratio of how far the mean of the output data is from the closer specification limit to three times their standard deviation. In the example scrubbing process described herein, the distance between the center 802 and the wire outline 715 results in a CPK value of at least 2.0. In conventional ball bonding techniques that use ultrasound, the distance between center 802 and the wire outline 715 is difficult to control and often is characterized by a CPK ratio of less than 1.33 or 1.67.

In example embodiments, the term "approximately" means that a value or range of values is either a stated value or range of values or within plus or minus 10% from that stated value or range of values. This disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for forming a ball bond for an integrated circuit formed on a semiconductor die, comprising:
    forming a ball at a first end of a conductive wire inserted in a capillary tool;
    lowering the capillary tool toward a pad on the semiconductor die positioned on a support surface;
    moving, using a motor, the support surface relative to the capillary tool to thereby bond the ball using a scrubbing action of the ball relative to the pad, and, without using ultrasound, to the pad; and
    raising the capillary tool.

2. The method of claim 1, wherein moving the support surface relative to the capillary tool includes moving the support surface relative to the capillary tool in a circular motion.

3. The method of claim 1, wherein moving the support surface relative to the capillary tool includes linearly moving the support surface relative to the capillary tool.

4. The method of claim 1, wherein:
    the conductive wire has a diameter of approximately 0.96 millimeters;
    lowering the capillary tool comprises applying a force between the ball and the pad in a range of 50 to 60 grams; and
    moving the support surface relative to the capillary tool comprises moving the ball relative to the pad with a lateral displacement in a range of 4 to 5.5 micrometers and moving the ball in 5 cycles relative to the pad.

5. The method of claim 1, wherein:
    the conductive wire has a diameter of approximately 1.3 millimeters;
    lowering the capillary tool comprises applying a force between the ball and the pad in a range of 45 to 65 grams; and
    moving the support surface relative to the capillary tool comprises moving the ball relative to the pad with a lateral displacement in a range of 5 to 6 micrometers and moving the ball in 6 cycles relative to the pad.

6. The method of claim 1, wherein:
    the conductive wire has a diameter of approximately 1.98 millimeters;
    lowering the capillary tool comprises applying a force between the ball and the pad in a range of 100 to 110 grams; and
    moving the support surface relative to the capillary tool comprises moving the ball relative to the pad with a lateral displacement in a range of 10 to 11 micrometers and moving the ball in 4 cycles relative to the pad.

7. The method of claim 1, further comprising heating the pad to a temperature approximately at least 250 degrees centigrade and wherein moving the support surface relative to the capillary tool comprises moving the support surface while the pad is at the temperature of approximately at least 250 degrees centigrade.

8. The method of claim 1, further comprising raising the capillary to form a loop in the conductive wire and forming a stitch bond on a leadframe.

9. The method of claim 8, further comprising singulating a wafer to obtain the semiconductor die and applying a mold compound to the semiconductor die and the leadframe.

10. A wire bonding connection for a semiconductor die pad formed according to a process comprising:
    forming a ball at a first end of a conductive wire inserted in a capillary tool;
    lowering the capillary tool toward a pad on the semiconductor die positioned on a support surface;
    moving, using a motor, the support surface relative to the capillary tool to thereby bond the ball using a scrubbing action of the ball relative to the pad, and, without using ultrasound, to the pad; and
    raising the capillary tool.

11. The wire bonding connection of claim 10, wherein moving the support surface relative to the capillary tool includes moving the support surface relative to the capillary tool in a circular motion.

12. The wire bonding connection of claim 10, wherein moving the support surface relative to the capillary tool includes linearly moving the support surface relative to the capillary tool.

13. The wire bonding connection of claim 10, wherein:
    the conductive wire has a diameter of approximately 0.96 millimeters;
    lowering the capillary tool comprises applying a force between the ball and the pad in a range of 50 to 60 grams; and
    moving the support surface relative to the capillary tool comprises moving the ball relative to the pad with a lateral displacement in a range of 4 to 5.5 micrometers and moving the ball in 5 cycles relative to the pad.

14. The wire bonding connection of claim 10, wherein:
    the conductive wire has a diameter of approximately 1.3 millimeters;
    lowering the capillary tool comprises applying a force between the ball and the pad in a range of 45 to 65 grams; and
    moving the support surface relative to the capillary tool comprises moving the ball relative to the pad with a lateral displacement in a range of 5 to 6 micrometers and moving the ball in 6 cycles relative to the pad.

15. The wire bonding connection of claim 10, wherein:
the conductive wire has a diameter of approximately 1.98 millimeters;
lowering the capillary tool comprises applying a force between the ball and the pad in a range of 100 to 110 grams; and
moving the support surface relative to the capillary tool comprises moving the ball relative to the pad with a lateral displacement in a range of 10 to 11 micrometers and moving the ball in 4 cycles relative to the pad.

16. The wire bonding connection of claim 10, further comprising heating the pad to a temperature approximately at least 250 degrees centigrade and wherein moving the support surface relative to the capillary tool comprises moving the support surface while the pad is at the temperature of approximately at least 250 degrees centigrade.

17. The wire bonding connection of claim 10, further comprising raising the capillary to form a loop in the conductive wire and forming a stitch bond on a leadframe.

\* \* \* \* \*